United States Patent
Kim et al.

(10) Patent No.: US 9,646,672 B1
(45) Date of Patent: May 9, 2017

(54) MEMORY DEVICE AND METHOD OF REFRESHING THE SAME

(71) Applicant: SK hynix Inc., Gyeonggi-do (KR)

(72) Inventors: Jong-Sam Kim, Gyeonggi-do (KR);
Jae-Il Kim, Gyeonggi-do (KR);
Youk-Hee Kim, Gyeonggi-do (KR);
Jun-Gi Choi, Gyeonggi-do (KR);
Hee-Seong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/236,638

(22) Filed: Aug. 15, 2016

(30) Foreign Application Priority Data

Apr. 25, 2016 (KR) .......................... 10-2016-0049981

(51) Int. Cl.
G11C 16/10 (2006.01)
G11C 11/406 (2006.01)
G11C 11/4091 (2006.01)

(52) U.S. Cl.
CPC ........ *G11C 11/406* (2013.01); *G11C 11/4091* (2013.01); *G11C 16/10* (2013.01)

(58) Field of Classification Search
CPC ................................ G11C 16/10; G11C 16/26
USPC ........................................ 365/189.05, 185.24
See application file for complete search history.

(56) References Cited

U.S. PATENT DOCUMENTS

| | | | |
|---|---|---|---|
| 5,644,545 A * | 7/1997 | Fisch | G11C 11/406 365/222 |
| 8,630,141 B2 | 1/2014 | Tamlyn | |
| 8,934,311 B2 * | 1/2015 | Yu | G11C 29/50 365/149 |
| 9,025,405 B2 * | 5/2015 | Jeong | G11C 11/402 365/149 |
| 9,129,702 B2 * | 9/2015 | Kim | G11C 11/406 |
| 9,165,637 B2 * | 10/2015 | Kim | G11C 11/40622 |
| 2016/0351248 A1 | 12/2016 | Jung | |

FOREIGN PATENT DOCUMENTS

KR 1020150002112 1/2015

\* cited by examiner

*Primary Examiner* — Michael Tran
(74) *Attorney, Agent, or Firm* — IP & T Group LLP

(57) ABSTRACT

A memory device includes a plurality of memory cells; a nonvolatile memory block suitable for simultaneously sensing one or more programmed weak addresses, and sequentially transmitting the sensed weak addresses; a weak address control block suitable for latching the weak addresses transmitted from the nonvolatile memory block, and outputting sequentially the latched weak addresses in a weak refresh operation; and a refresh control block suitable for controlling the memory cells corresponding to the counting address to be refreshed, in a normal refresh operation, and controlling the memory cells corresponding to the weak address to be refreshed, in the weak refresh operation.

19 Claims, 12 Drawing Sheets

MEMORY DEVICE AND METHOD OF REFRESHING THE SAME

CROSS-REFERENCE TO RELATED APPLICATION

This application claims priority under 35 U.S.C. §119(a) to Korean Patent Application No. 10-2016-0049981 filed on Apr. 25, 2016 in the Korean Intellectual Property Office, the disclosure of which is incorporated herein by reference in its entirety.

TECHNICAL FIELD

Exemplary embodiments relate generally to a memory device and a method of refreshing the memory device.

DISCUSSION OF THE RELATED ART

A memory cell of a memory device is constructed by a capacitor for storing charges (data) and a transistor serving as a switch for controlling the flow of charges to and from the capacitor. Data is divided into 'high' (logic 1) or 'low' (logic 0) depending on whether charges are present in the capacitor of the memory cell, that is, whether a voltage at the terminal of the capacitor is high or low.

In principle, retention of data should not consume power because retention of data is implemented in such a manner that accumulated charges in a capacitor are simply kept there. However, data may be lost because an initial charge stored in a capacitor may eventually vanish due to a leakage current attributable to the PN coupling of a MOS transistor. To prevent this, data in a memory cell should be read before the data is lost, and a normal amount of charges should be recharged based on read information. Hence, data may be retained only when such an operation is periodically repeated. Such a process for recharging cell charges is called a refresh operation.

The refresh operation is performed each time a refresh command is inputted from a memory controller to a memory device. The memory controller inputs the refresh command to the memory device with a predetermined time interval by considering the data retention time of the memory device. For example, if the data retention time of a memory device is 64 ms and there are 8000 memory cells in the memory device, then all the memory cells in the memory device may be refreshed only when the refresh command is inputted 8000 times, i.e., when the memory controller inputs the refresh command to the memory device 8000 times in a period of 64 ms.

Meanwhile, memory cells coupled to word lines adjacent to a word line which is frequently activated or defective memory cells, may have a shorter data retention time than a predetermined reference retention time for the device. In this case, an error is likely to occur in the operation of a memory device, when only the above-described refresh operation is performed.

FIG. 1 is a diagram illustrating an example of a portion of a cell array included in a memory device to assist in the explanation of a phenomenon that occurs in memory cells coupled to word lines adjacent to a word line which is frequently activated. The reference symbol BL designates bit lines.

Referring to FIG. 1, the reference symbols WLK−1, WLK and WLK+1 designate three word lines which are arranged side by side in a cell array. The word line WLK indicated by the reference symbol ATTACK_WL is a word line of which activation count is large, activation frequency is high or activation time is long. The word lines WLK−1 and WLK+1 are word lines which are disposed adjacent on either side of the word line WLK. The reference symbols CELL_K−1, CELL_K and CELL_K+1 designate memory cells which are coupled to the word lines WLK−1, WLK and WLK+1, respectively. The memory cells CELL_K−1, CELL_K and CELL_K+1 include cell transistors TR_K−1, TR_K and TR_K+1 and cell capacitors CAP_K−1, CAP_K and CAP_K+1, respectively.

In FIG. 1, in the case where the word line WLK is activated many times, activated frequently or activated for a long time, the voltage of the word line WLK toggles frequently or is retained as a high voltage for a long time. As a consequence, due to a coupling phenomenon occurring between the word line WLK and the word lines WLK−1 and WLK+1, influences may be exerted on the memory cells CELL_K−1 and CELL_K+1 coupled to the word lines WLK−1 and WLK+1. Such influences may shorten a time for which data stored in memory cells may be retained.

SUMMARY

Various embodiments are directed to a memory device capable of performing an improved refresh operation and a method of operation thereof. The refresh operation may allow memory cells having a data retention time shorter than a reference retention time may operate normally.

In an embodiment, a memory device may include: a plurality of memory cells; a nonvolatile memory block suitable for simultaneously sensing one or more programmed weak addresses, and sequentially transmitting the sensed weak addresses; a weak address control block suitable for latching the weak addresses transmitted from the nonvolatile memory block, and outputting sequentially the latched weak addresses in a weak refresh operation; and a refresh control block suitable for controlling the memory cells corresponding to the counting address to be refreshed, in a normal refresh operation, and controlling the memory cells corresponding to the weak address to be refreshed, in the weak refresh operation.

In an embodiment, a memory device may include: a plurality of memory cells; a refresh counter suitable for generating a counting address; a nonvolatile memory block suitable for storing one or more weak addresses and transmitting the stored weak addresses; a latch circuit suitable for latching the weak addresses transmitted from the nonvolatile memory block; and a refresh control block suitable for enabling a refresh signal at least one time in response to a refresh command, and enabling a weak refresh signal for a period that is determined by the number of times by which the refresh signal is enabled, wherein the memory cells corresponding to the counting address are refreshed in the case where the refresh signal is enabled, and the memory cells corresponding to a weak address latched by the latch circuit are refreshed in the case where the refresh signal and the weak refresh signal are enabled.

In an embodiment, a method of refreshing memory cells may include: refreshing a plurality of first memory cells in a core region; and refreshing a plurality of second memory cells in the core region more frequently than the first memory cells. The refreshing the plurality of second memory cells may include: storing a plurality of weak addresses in a nonvolatile memory block coupled to the core region; simultaneously sensing the plurality of weak addresses; and sequentially transmitting the plurality of weak addresses with a time interval to the core region.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
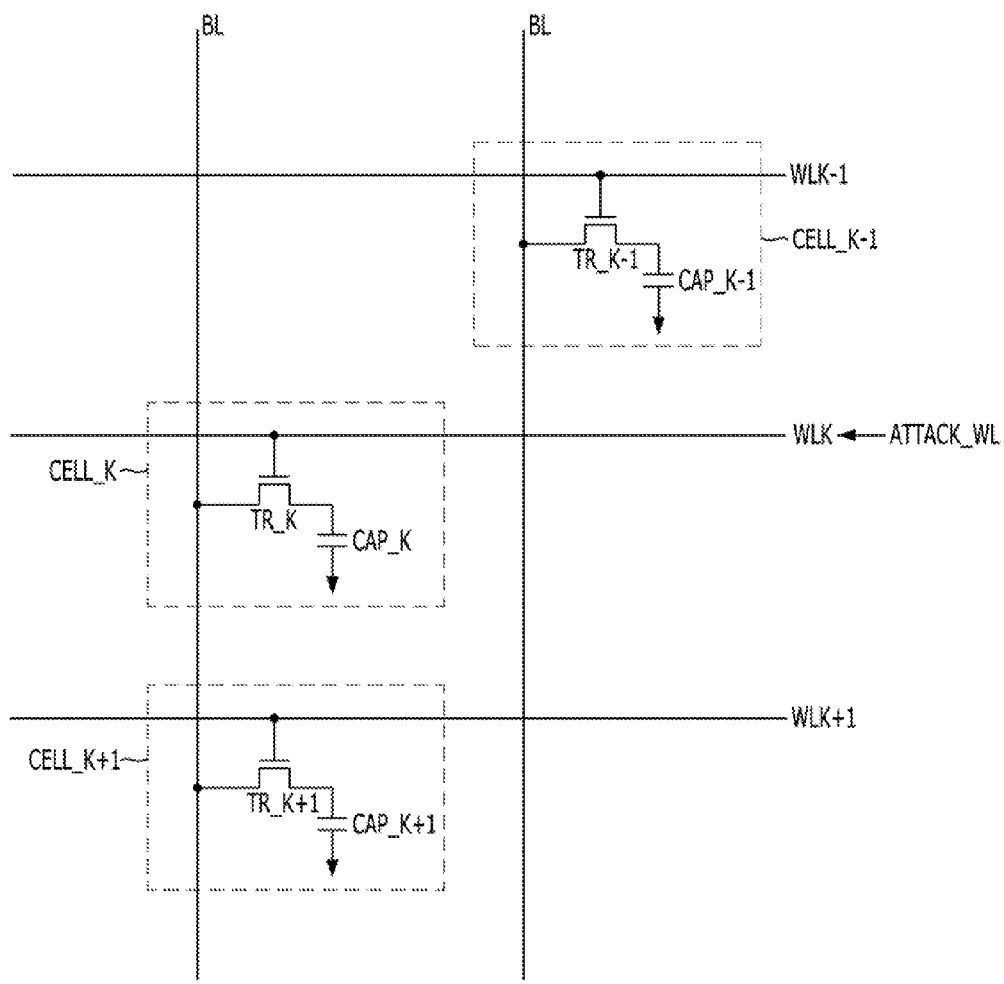
FIG. 1 is a diagram illustrating a representation of a cell array included in a memory device.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments.

It will be understood that when an element is referred to as being "connected to", or "coupled to" another element, it may be directly on, connected to, or coupled to the other element, or one or more intervening elements may be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

In the following descriptions, a normal refresh operation refers to an operation that refreshes memory cells (or a word line) corresponding to a counting address. A weak refresh operation refers to an operation that refreshes memory cells (or a word line) corresponding to a weak address, and a target refresh operation refers to an operation that refreshes memory cells (or a word line) corresponding to a target address.

Figure 2:
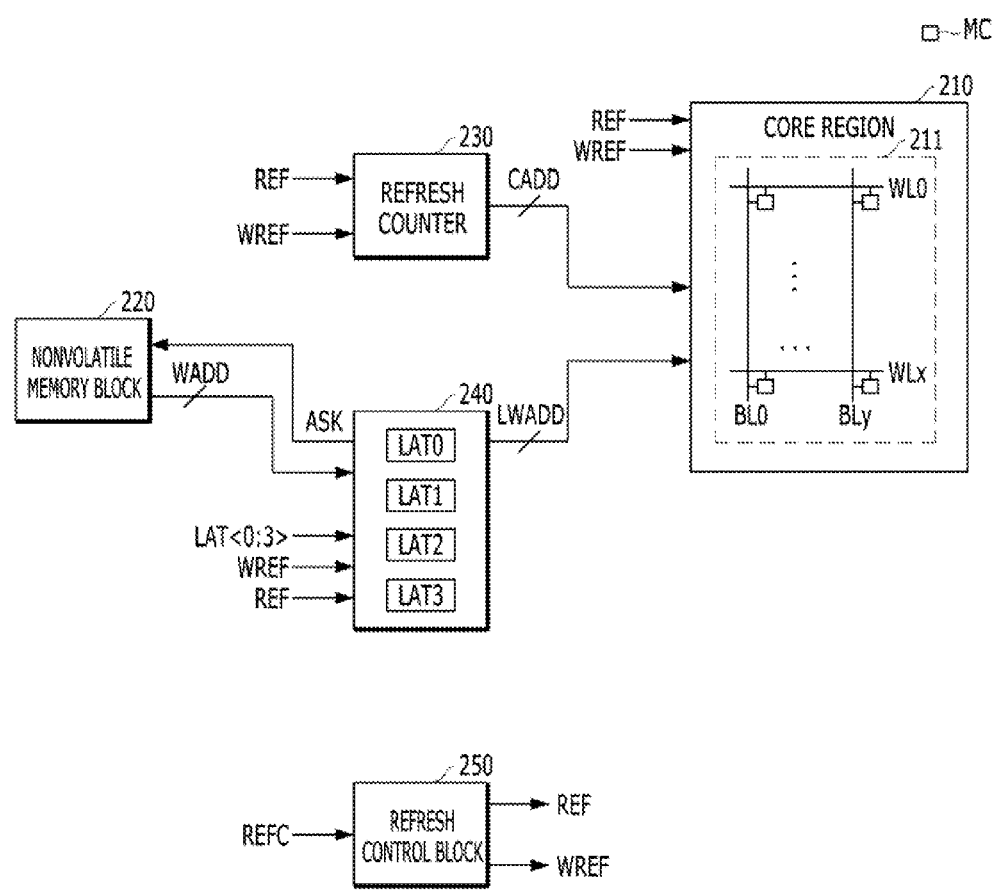
FIG. 2 is a configuration diagram illustrating an example of a memory device, in accordance with an embodiment of the present invention.

FIG. 2 is a configuration diagram illustrating an example of a memory device, according to an embodiment of the present invention.

Referring to FIG. 2, a memory device may include a core region 210, a nonvolatile memory block 220, a refresh counter 230, a weak address control block 240, and a refresh control block 250.

The core region 210 may include a cell array 211 and a plurality of control circuits (not shown) for controlling the cell array 211. The cell array 211 may include a plurality of word lines WL0 to WLx (x is a natural number), a plurality of bit lines BL0 to BLy (y is a natural number), and a plurality of memory cells MC coupled between the word lines WL0 to WLx and the bit lines BL0 to BLy. The numbers of the word lines WL0 to WLx, the bit lines BL0 to BLy and the memory cells MC may be changed according to design. In an embodiment, each of the memory cells MC in the core region 210 may be or include a dynamic random access memory (DRAM) cell.

The core region 210 may control a normal refresh operation to be performed for a word line corresponding to a counting address CADD, in the case where a refresh signal REF is enabled in the state in which a weak refresh signal WREF is disabled, and may control a weak refresh operation to be performed for a word line corresponding to an address LWADD outputted from the weak address control block 240, in the case where the refresh signal REF is enabled in the state in which the weak refresh signal WREF is enabled.

The nonvolatile memory block 220 may store one or more weak addresses. When a weak refresh operation is performed, the nonvolatile memory block 220 may sequentially output the one or more weak addresses programmed therein, to the weak address control block 240. An address WADD outputted from the nonvolatile memory block 220 may be transmitted to the weak address control block 240 from the nonvolatile memory bock 220. The nonvolatile memory block 220 may simultaneously sense weak addresses stored therein, when an ask signal ASK is enabled and transmitted NNNto the nonvolatile memory block 220 from the weak address control block 240, and may sequentially output the sensed weak addresses, as the address WADD, with a time interval.

Figure 3:
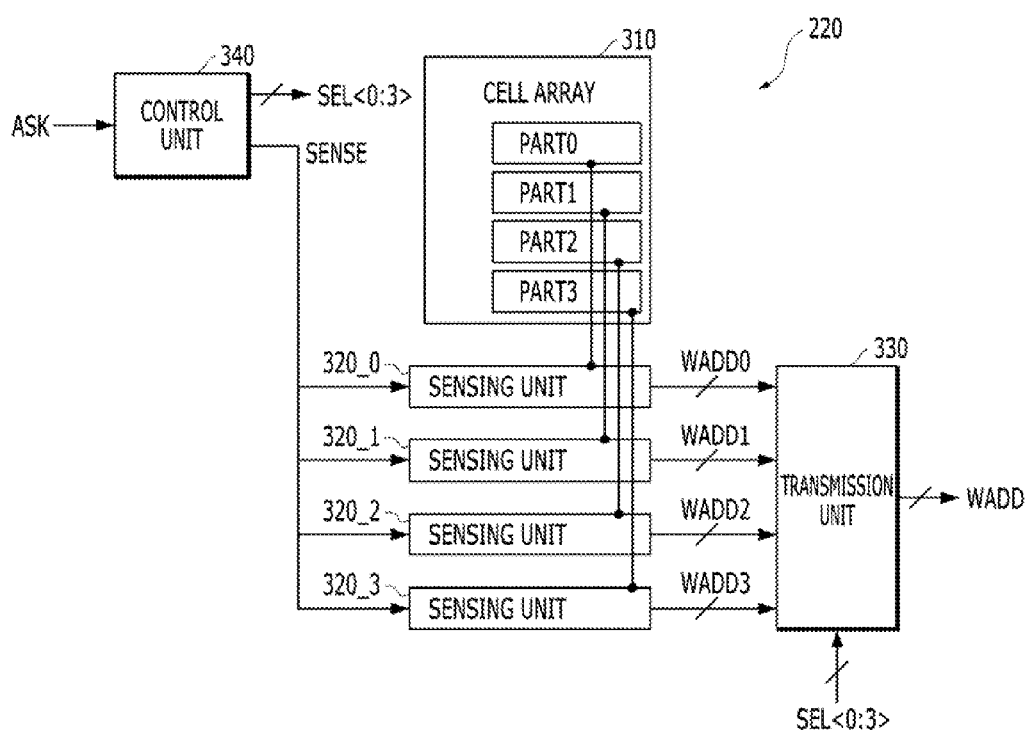
FIG. 3 is a configuration diagram illustrating an example of the nonvolatile memory block 220 shown in FIG. 2.

FIG. 3 is a configuration diagram illustrating an example of the nonvolatile memory block 220.

Referring to FIG. 3, the nonvolatile memory block 220 may include a cell array 310, a plurality of sensing units, for example, sensing units 320_0 to 320_3, a transmission unit 330, and a control unit 340.

The cell array 310 in the nonvolatile memory block 220 may include at least one of nonvolatile memory circuits such as a fuse circuit, a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), and various circuits which perform functions similar to the nonvolatile memory circuits and store data. In an embodiment, the cell array 310 may include a fuse circuit.

The cell array 310 may include a plurality of nonvolatile memory cells, and store one or more weak addresses. Hereinbelow, descriptions will be made for the case where four weak addresses are stored in the cell array 310 and first to fourth parts PART0 to PART3 in which the respective weak addresses are stored are sensed by different sensing units 320_0 to 320_3.

The control unit 340 may enable a sensing signal SENSE when the ask signal ASK is enabled. Also, the control unit 340 may sequentially enable first to fourth selection signals SEL<0:3> after a sufficient time for completing the sensing operation passes from when the sensing signal SENSE is enabled.

The plurality of sensing units 320_0 to 320_3 may sense weak addresses stored in corresponding parts of the first to fourth parts PART0 to PART3, when the sensing signal SENSE is enabled. The sensing operations of the sensing units 320_0 to 320_3 may be performed simultaneously. Here, the sensing operations may refer to operations of reading the weak addresses stored in the first to fourth parts PART0 to PART3, into the sensing units 320_0 to 320_3, and latching the weak addresses. The plurality of sensing units 320_0 to 320_3 may output sensed weak addresses WADD0 to WADD3, respectively.

The transmission unit 330 may sequentially transmit the weak addresses WADD0 to WADD3 respectively outputted from the sensing units 320_0 to 320_3, as the address WADD, with a time interval between two consecutive transmissions, in response to the first to fourth selection signals SEL<0:3>.

The transmission unit 330 may output the address WADD by selecting the weak address WADD0 outputted from the sensing unit 320_0 when the first selection signal SEL<0> is enabled, output the address WADD by selecting the weak address WADD1 outputted from the sensing unit 320_1 when the second selection signal SEL<1> is enabled, output the address WADD by selecting the weak address WADD2 outputted from the sensing unit 320_2 when the third selection signal SEL<2> is enabled, and output the address WADD by selecting the weak address WADD3 outputted from the sensing unit 320_3 when the fourth selection signal SEL<3> is enabled.

As may be readily understood from the above descriptions, even in the case where at least two weak addresses are to be transmitted, the nonvolatile memory block 220 first simultaneously senses and then sequentially outputs the weak addresses. As a consequence, it is possible to quickly transmit weak addresses even in the case where the number of weak addresses to transmit is large. Moreover, when outputting sensed weak addresses, since the sensed weak addresses are sequentially outputted by being arranged in series, the number of transmission lines needed to transmit weak addresses may be decreased.

Referring to FIGS. 2 and 3, the refresh counter 230 may count each time the refresh signal REF is enabled, and generate the counting address CADD. For example, the refresh counter 230 may increase the value of the counting address CADD by 1 each time the refresh signal REF is enabled. Increasing the value of the counting address CADD by 1 indicates that the counting address CADD is changed so that, if a K^th word line is selected this time, a (K+1)^th word line is selected next time. However, in the case where the weak refresh signal WREF is enabled, the refresh counter 230 does not perform a counting operation when the refresh signal REF is enabled, and, hence, the value of the counting address CADD does not increase but remains the same.

The weak address control block 240 latches the weak addresses WADD transmitted from the nonvolatile memory block 220, and sequentially output the latched weak addresses WADD as the address LWADD in the weak refresh operation. The weak address control block 240 may include a plurality of latch units LAT0 to LAT3 each capable of latching one weak address. Each of first to fourth latch signals LAT<0:3> corresponds to one latch unit, and the respective latch units LAT0 to LAT3 may latch the transmitted weak addresses WADD when the corresponding latch signals LAT<0:3> are enabled.

For reference, the plurality of latch signals LAT<0:3> may be signals which are generated by delaying the plurality of selection signals SEL<0:3> by a predetermined delay time. The predetermined delay time may be designed in consideration of a time that is required for the weak address WADD outputted from the nonvolatile memory block 220 to reach the weak address control block 240.

The weak address control block 240 may sequentially select the plurality of latch units LAT0 to LAT3 one by one each time the refresh signal REF is enabled in the state in which the weak refresh signal WREF is enabled, and output the weak address WADD latched by a selected latch unit, as the address LWADD. For example, the weak address control block 240 may output, as the address LWADD, the weak addresses WADD respectively latched by the latch units LAT0 to LAT3 when the refresh signal REF is enabled first to fourth times in the case where the refresh signal REF is enabled four times in the state in which the weak refresh signal WREF is enabled. Further, the weak address control block 240 may enable the ask signal ASK when the weak refresh signal WREF is enabled.

The refresh control block 250 may enable the refresh signal REF by a preset number of times equal to or more than one time when the refresh command REFC is applied, count the number of times by which the refresh signal REF is enabled, and enable the weak refresh signal WREF for a predetermined period when the refresh signal REF is enabled a predetermined number of times.

For example, in the case of refreshing a word line corresponding to one weak address during a weak refresh operation period, the refresh control block 250 may enable the weak refresh signal WREF when the refresh signal REF is enabled eight times, and disable the weak refresh signal WREF when the refresh signal REF is enabled one time thereafter.

In the case of refreshing word lines corresponding to four weak addresses during a weak refresh operation period, the refresh control block 250 may enable the weak refresh signal WREF when the refresh signal REF is enabled eight times, and disable the weak refresh signal WREF when the refresh signal REF is enabled four times thereafter.

Figure 4A:
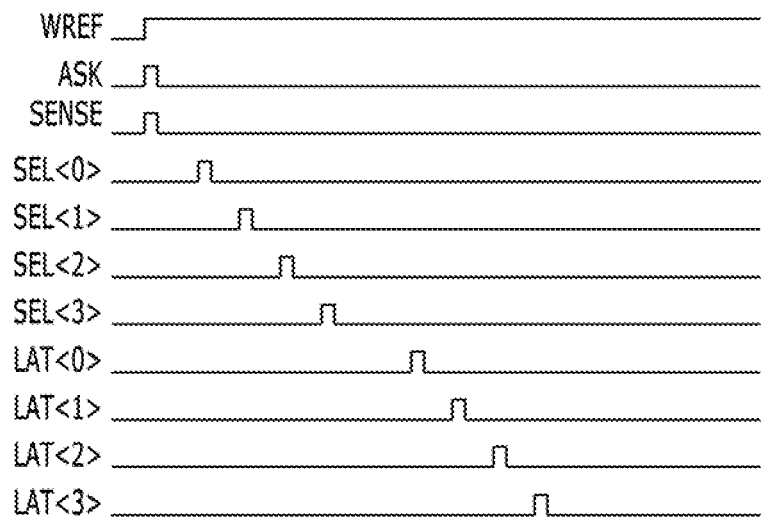
FIGS. 4A and 4B are timing diagrams used to assist in explaining the operation of the memory device shown in FIG. 2.
Figure 4B:
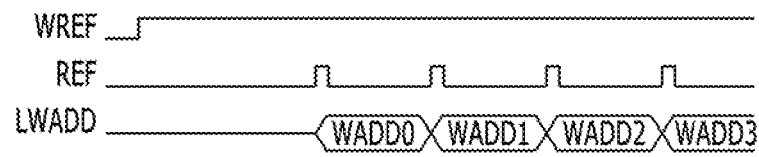

FIGS. 4A and 4B are timing diagrams to assist in the explanation of the operation of the memory device shown in FIG. 2.

FIG. 4A is a diagram to assist in the explanation of the operation in which the weak addresses stored in the nonvolatile memory block 220 are sequentially outputted with the time interval and are sequentially latched by the weak address control block 240.

If the weak refresh signal WREF is enabled, the ask signal ASK may be enabled. If the ask signal ASK is enabled, the sensing signal SENSE may be enabled and the four weak addresses may be simultaneously sensed, in the nonvolatile memory block 220. Thereafter, the sensed weak addresses WADD0 to WADD3 are sequentially transmitted from the nonvolatile memory block 220 as the selection signals SEL<0:3> are sequentially enabled at a regular time interval between two consecutive transmissions. The transmitted weak addresses WADD0 to WADD3 are sequentially latched by the weak address control block 240 as the latch signals LAT<0:3> are sequentially enabled.

FIG. 4B is an example of a diagram to assist in the explanation of the operation in which the weak addresses WADD0 to WADD3 latched by the weak address control block 240 are sequentially outputted and transmitted to the core region 210 in the weak refresh operation.

Assuming that the refresh command REFC is applied successively four times in the state in which the weak refresh signal WREF is enabled, the refresh signal REF may be enabled successively four times. The weak address WADD0 latched by the latch unit LAT0 may be outputted as the address LWADD when the refresh signal REF is enabled first, the weak address WADD1 latched by the latch unit LAT1 may be outputted as the address LWADD when the refresh signal REF is enabled second, the weak address WADD2 latched by the latch unit LAT2 may be outputted as the address LWADD when the refresh signal REF is enabled third, and the weak address WADD3 latched by the latch unit LAT3 may be outputted as the address LWADD when the refresh signal REF is enabled fourth.

In the memory device of FIG. 2, weak refresh may be performed using the weak addresses stored in the nonvolatile memory block 220 to manage weak cells so that they operate normally, and a number of weak addresses may be simultaneously sensed and transmitted in real time. As a consequence, even in the case where a refresh command is applied successively at least two times with a narrow interval, a weak refresh operation may be performed.

Figure 5:
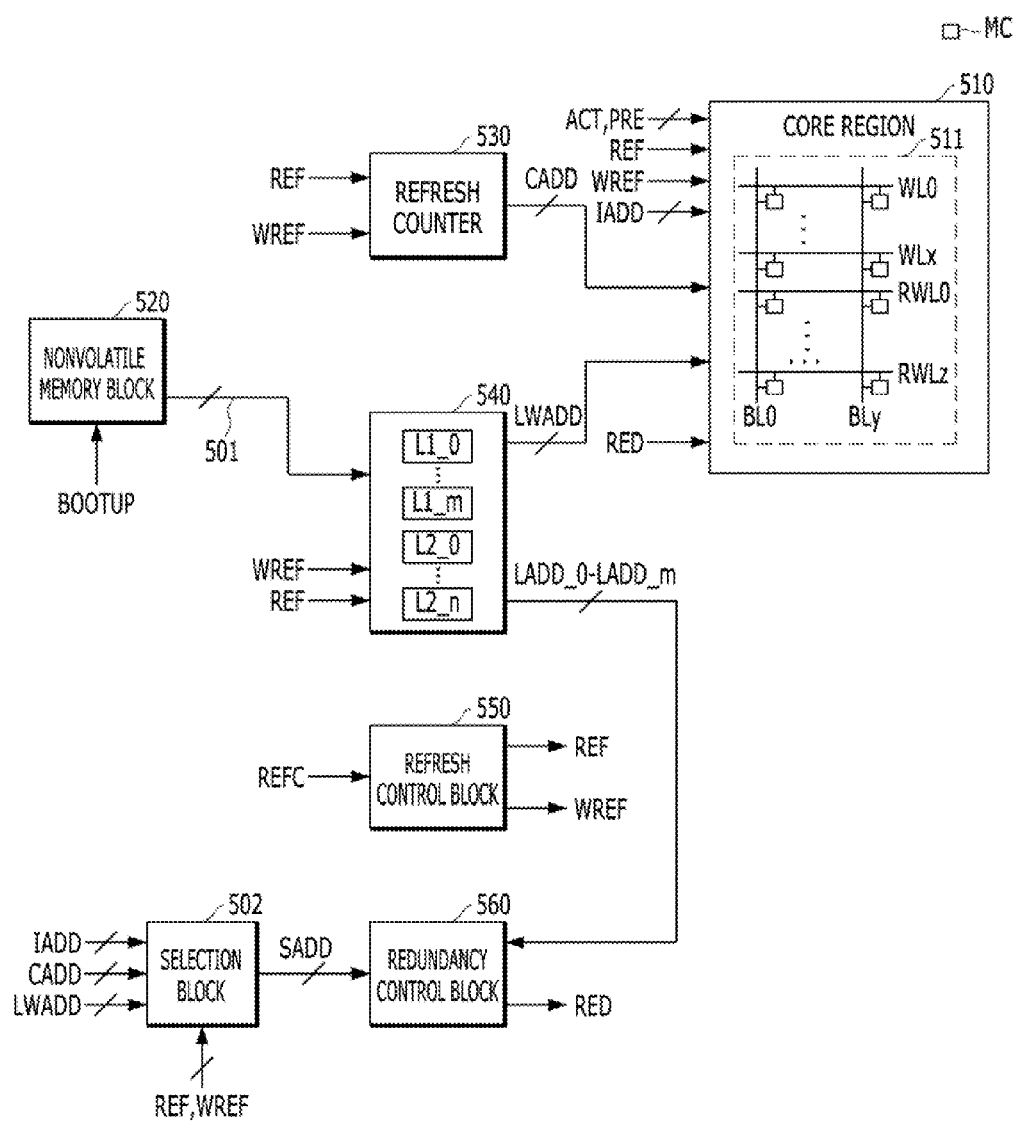
FIG. 5 is a configuration diagram illustrating an example of a memory device, in accordance with an embodiment of the present invention

FIG. 5 is a configuration diagram illustrating an example of a memory device, according to an embodiment of the present invention.

Referring to FIG. 5, a memory device may include a core region 510, a nonvolatile memory block 520, a refresh counter 530, a latch circuit 540, a refresh control block 550, a selection block 502 and a redundancy control block 560.

The core region 510 may include a cell array 511 and a plurality of control circuits (not shown) for controlling the cell array 511. The cell array 511 may include a plurality of word lines WL0 to WLx (x is a natural number), a plurality of bit lines BL0 to BLy (y is a natural number), one or more redundancy word lines RWL0 to RWLz (z is a natural number), and a plurality of memory cells MC.

The core region 510 may control a word line corresponding to an addressIADD, CADD or LWADD to be accessed in the case where a redundancy signal RED is disabled, and control a redundancy word line replacing a word line corresponding to the addressIADD, CADD or LWADD to be accessed in the case where the redundancy signal RED is enabled.

In the case where the redundancy signal RED is disabled, the core region 510 may control a word line corresponding to an input addressIADD to be activated in response to an active signal ACT, and control the activated word line to be precharged in response to a precharge signal PRE. In the case where the redundancy signal RED is enabled, the core region 510 may control a redundancy word line replacing a word line corresponding to the input address IADD to be activated in response to the active signal ACT, and control the activated redundancy word line to be precharged in response to the precharge signal PRE.

The core region 510 may control a normal refresh operation to be performed for a word line corresponding to a counting address CADD, when a refresh signal REF is enabled in the state in which a weak refresh signal WREF is disabled in the case where the redundancy signal RED is disabled, and control a normal refresh operation to be performed for a redundancy word line replacing a word line corresponding to the counting address CADD, when the refresh signal REF is enabled in the state in which the weak refresh signal WREF is disabled in the case where the redundancy signal RED is enabled.

The core region 510 may control a weak refresh operation to be performed for a word line corresponding to an address LWADD outputted from the latch circuit 540, when the refresh signal REF is enabled in the state in which the weak refresh signal WREF is enabled in the case where the redundancy signal RED is disabled, and control a weak refresh operation to be performed for a redundancy word line replacing a word line corresponding to the address LWADD outputted from the latch circuit 540, when the refresh signal REF is enabled in the state in which the weak refresh signal WREF is enabled in the case where the redundancy signal RED is enabled.

The nonvolatile memory block 520 may store one or more repair addresses and one or more weak addresses. The nonvolatile memory block 520 may output the repair addresses and the weak addresses programmed therein, in a boot-up operation (where a boot-up signal BOOTUP is enabled). The addresses outputted from the nonvolatile memory block 520 may be transmitted to the latch circuit 540 through one or more address transfer lines 501.

The configuration and operation of the refresh counter 530 may be the same as the configuration and operation of the refresh counter 230 of FIG. 2.

The latch circuit 540 may latch the addresses transmitted from the nonvolatile memory block 520. The latch circuit 540 may include a plurality of first latch units L1_0 to L1_$m$ (m is a natural number) and a plurality of second latch units L2_0 to L2_$n$ (n is a natural number). The plurality of first latch units L1_0 to L1_$m$ may be latch units for latching repair addresses, and the plurality of second latch units L2_0 to L2_$n$ may be latch units for latching weak addresses.

The latch circuit 540 may output addresses LADD_0 to LADD_m latched by the plurality of first latch units L1_0 to L1_$m$, to the redundancy control block 560. Also, the latch circuit 540 may sequentially output one by one the addresses stored in the plurality of second latch units L2_0 to L2_$n$, as the address LWADD, each time the refresh signal REF is enabled in the state in which the weak refresh signal WREF is enabled.

Figure 6:
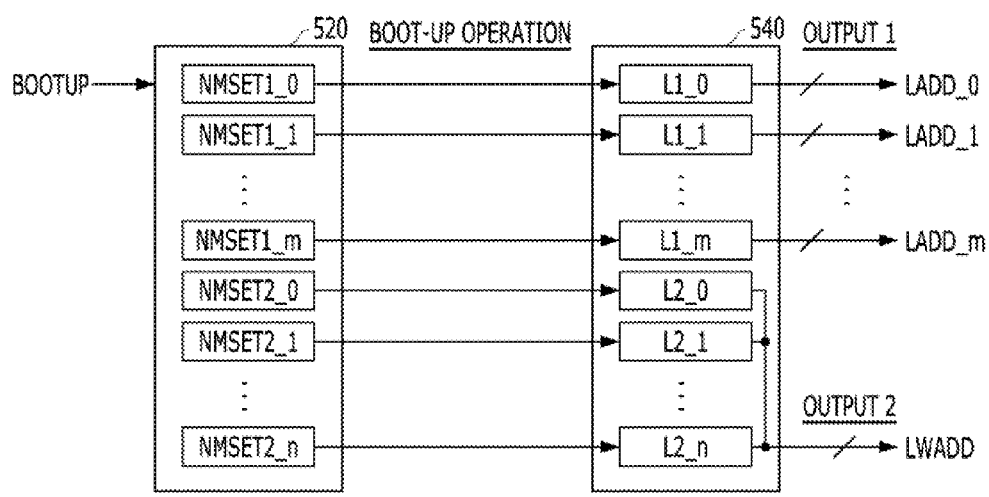
FIG. 6 is a diagram to assist in the explanation of a boot-up operation and the address output operation of the latch circuit 540 shown in FIG. 5.

FIG. 6 is an example of a diagram to assist in the explanation of a boot-up operation and the address output operation of the latch circuit 540.

In FIG. 6, the plurality of nonvolatile memory cells included in the nonvolatile memory block 520 are illustrated by being divided into sets NMSET1_0 to NMSET1_$m$ and NMSET2_0 to NMSET2_$n$ each capable of storing one address.

In a boot-up operation, the addresses stored in the sets NMSET1_0 to NMSET1_$m$ and NMSET2_0 to NMSET2_$n$ may be sequentially outputted and respectively latched by the corresponding latch units L1_0 to L1_$m$ and L2_0 to L2_$n$ of the latch circuit 540 (see BOOT-UP OPERATION). When the boot-up operation is completed, the addresses latched by the latch units L1_0 to L1_$m$ are all outputted as the addresses LADD_0 to LADD_m (see OUTPUT1), whereas the addresses latched by the latch units L2_0 to L2_$n$ may be sequentially outputted as the address LWADD each time the refresh signal REF is enabled in the state in which the weak refresh signal WREF is enabled (see OUTPUT2). That is to say, with the weak refresh signal WREF enabled, the address latched by the latch unit L2_0 may be outputted as the address LWADD in the case where the refresh signal REF is enabled a first time, the address latched by the latch unit L2_1 may be outputted as the address LWADD in the case where the refresh signal REF is enabled a second time, . . . , and the address latched by the latch unit L2_$n$ may be outputted as the address LWADD in the case where the refresh signal REF is enabled an (n+1)^th.

Referring to FIGS. 5 and 6, the refresh control block 550 may enable the refresh signal REF at least one time when a refresh command REFC is applied, and enable the weak refresh signal WREF under a predetermined condition. For example, the refresh control block 550 may enable the weak refresh signal WREF for a period that is determined by the number of times by which the refresh signal REF is enabled. The condition under which the weak refresh signal WREF is enabled will be described later with reference to FIGS. 8A to 8D.

The redundancy control block 560 may compare the addresses LADD_0 to LADD_m outputted from the latch circuit 540 and an address SADD selected by a selection block 502, and generate the redundancy signal RED. The redundancy control block 560 may enable the redundancy signal RED when the same address as the selected address SADD exists in the addresses LADD_0 to LADDm, and disable the redundancy signal RED otherwise.

For reference, the selection block 502 may select the input address IADD, but may select the counting address CADD in the case where the weak refresh signal WREF is disabled and the refresh signal REF is enabled and select the address LWADD outputted from the latch circuit 540 in the case where the weak refresh signal WREF is enabled and the refresh signal REF is enabled.

Figure 7:
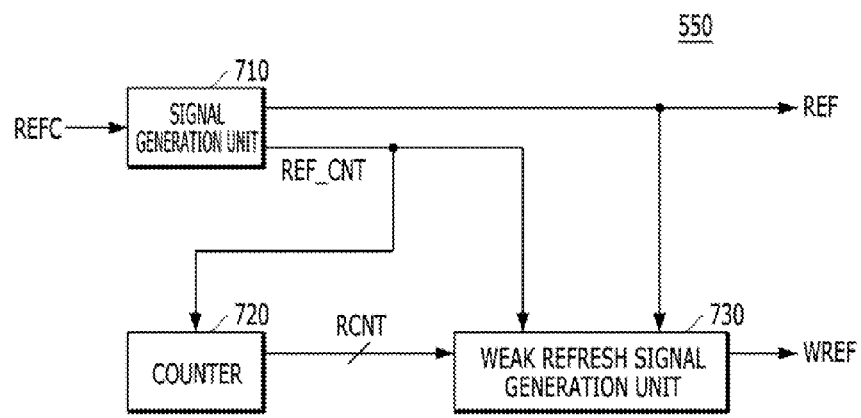
FIG. 7 is a configuration diagram illustrating an example of the refresh control block 550 shown in FIG. 5.

FIG. 7 is a configuration diagram illustrating an example of the refresh control block 550.

Referring to FIG. 7, the refresh control block 550 may include a signal generation unit 710, a counter 720, and a weak refresh signal generation unit 730.

The signal generation unit 710 may generate the refresh signal REF which is enabled when the refresh command REFC is applied, and generate a refresh counting signal REF_CNT by delaying the refresh signal REF. The signal generation unit 710 may disable the refresh counting signal REF_CNT in the case where the weak refresh signal WREF is enabled.

The counter 720 may perform counting when the refresh counting signal REF_CNT is enabled, and generate a refresh counting information RCNT.

The weak refresh signal generation unit 730 may enable the weak refresh signal WREF in response to the refresh counting signal REF_CNT in the case where the refresh counting information RCNT has a predetermined value, and disable the weak refresh signal WREF when the refresh signal REF is enabled by a preselected number of times in the state in which the weak refresh signal WREF is enabled.

FIGS. 8A to 8D are examples of diagrams to assist in the explanation of the refresh operation of the memory device and the operation of the refresh control block 550 shown in FIG. 5. In the following descriptions, the reference symbol NR indicates a normal refresh operation, and the reference symbol WR indicates a weak refresh operation. The refresh command REFC is designated by the reference symbols R1, R2, . . . according to the number of application times thereof.

Figure 8A:
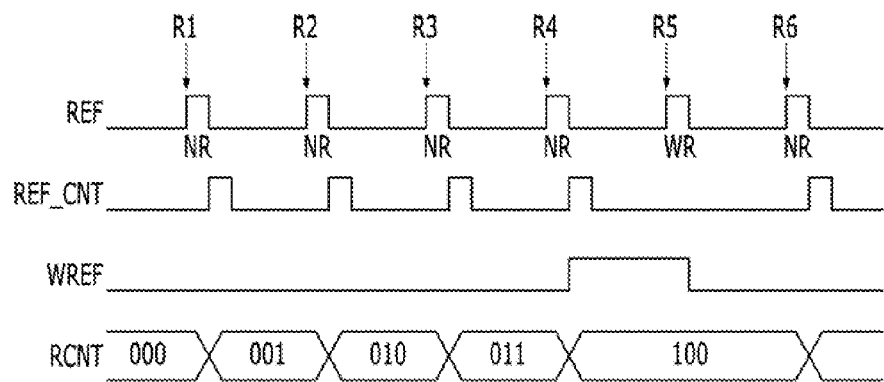
FIGS. 8A to 8D are examples of diagrams to assist in the explanation of the refresh operation of the memory device and the operation of the refresh control block 550 shown in FIG. 5.

FIG. 8A is a diagram showing the case where the refresh signal REF is enabled a first time when the refresh command REFC is applied and the weak refresh operation is performed when the refresh signal REF is enabled a fifth time. Herein, it is assumed that the refresh counting information RCNT is repetitively counted as 000, 001, 010, 011 and 100 and the weak refresh signal WREF is enabled when the refresh counting information RCNT becomes 100 and is disabled when the refresh signal REF is enabled one time after the weak refresh signal WREF is enabled.

Referring to FIG. 8A, in the case where the refresh command REFC is applied first to fourth times (see R1 to R4), the refresh signal REF may be enabled first to fourth times, respectively. At this time, because the weak refresh signal WREF is not enabled, the normal refresh operations NR may be performed. When the refresh counting information RCNT becomes 100 as the refresh signal REF is enabled four times, the weak refresh signal WREF is enabled. When the refresh signal REF is enabled in the state in which the weak refresh signal WREF is enabled, the weak refresh operation WR is performed, and then, the weak refresh signal WREF is disabled. In the state in which the weak refresh signal WREF is enabled, since the refresh counting signal REF_CNT is not enabled, the value of the refresh counting information RCNT is not changed and is retained as 100. If the refresh signal REF is enabled after the weak refresh signal WREF is disabled, the value of the refresh counting information RCNT may be changed. After that, the above-described operations may be repeated.

For reference, according to FIG. 8A, the memory device may perform the weak refresh operation WR at least one time in response to a predetermined refresh command.

Figure 8B:
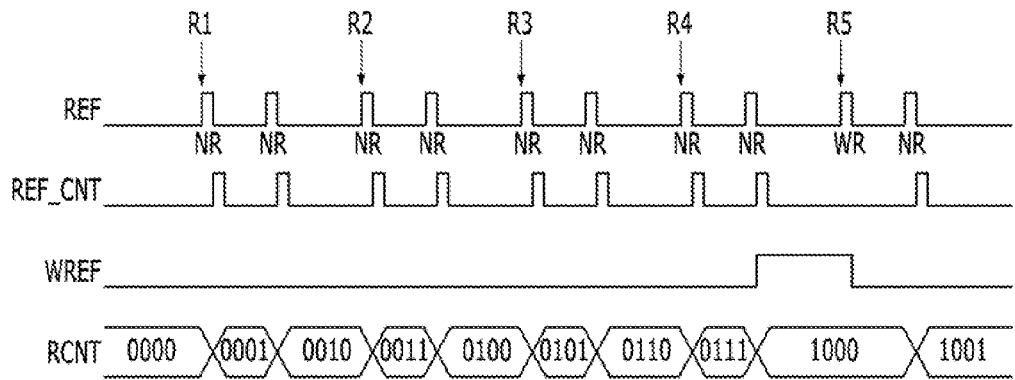

FIG. 8B is a diagram showing the case where the refresh signal REF is enabled two times when the refresh command REFC is applied and the weak refresh operation is performed when the refresh signal REF is enabled for a ninth time. Herein, it is assumed that the refresh counting information RCNT is repetitively counted as 0000, 0001, 0010, 0011, 0100, 0101, 0110, 0111, 1000 and 1001 and the weak refresh signal WREF is enabled when the refresh counting information RCNT becomes 1000 and is disabled when the refresh signal REF is enabled one time after the weak refresh signal WREF is enabled.

Referring to FIG. 8B, in the case where the refresh counting information RCNT is 0000 to 0111, because the weak refresh signal WREF is not enabled, the normal refresh operations NR may be performed when the refresh signal REF is enabled. When the refresh counting information RCNT becomes 1000, the weak refresh signal WREF is enabled. When the refresh signal REF is enabled in the state in which the weak refresh signal WREF is enabled, the weak refresh operation WR may be performed, and then, the weak refresh signal WREF may be disabled. In the state in which the weak refresh signal WREF is enabled, since the refresh counting signal REF_CNT is not enabled, the value of the refresh counting information RCNT is not changed and is retained as 1000. If the refresh signal REF is enabled after the weak refresh signal WREF is disabled, the value of the refresh counting information RCNT may be changed. As the refresh signal REF is enabled, the normal refresh operation NR may be performed again. After that, the above-described operations may be repeated.

For reference, according to FIG. 8B, the memory device may perform the weak refresh operation at least one time and the normal refresh operation at least one time in response to a predetermined refresh command.

Figure 8C:
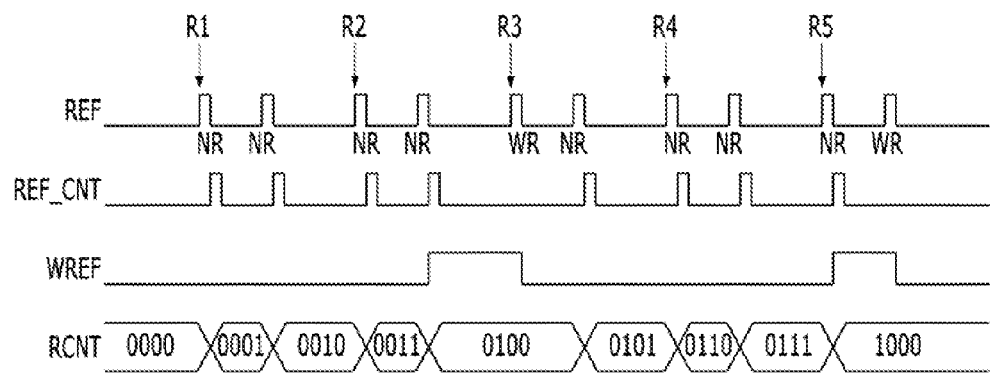

FIG. 8C is a diagram showing the case where the refresh signal REF is enabled two times when the refresh command REFC is applied and the weak refresh operation is performed when the refresh signal REF is enabled for a fifth and tenth times. Herein, it is assumed that the refresh counting information RCNT is repetitively counted as 0000, 0001, 0010, 0011, 0100, 0101, 0110, 0111 and 1000. The weak refresh signal WREF is enabled when the refresh counting information RCNT is 0100 or 1000 and is disabled when the refresh signal REF is enabled one time after the weak refresh signal WREF is enabled.

Referring to FIG. 8C, in the case where the refresh counting information RCNT is 0000 to 0011 and 0101 to 0111, because the weak refresh signal WREF is not enabled, the normal refresh operations NR may be performed when the refresh signal REF is enabled. If the refresh counting information RCNT becomes 0100 or 1000, the weak refresh signal WREF may be enabled. If the refresh signal REF is enabled in the state in which the weak refresh signal WREF is enabled, the weak refresh operation WR may be performed, and then, the weak refresh signal WREF may be disabled. In the state in which the weak refresh signal WREF is enabled, since the refresh counting signal REF_CNT is not enabled, the value of the refresh counting information RCNT is not changed and is retained as 0100 (or 1000). If the refresh signal REF is enabled after the weak refresh signal WREF is disabled, the value of the refresh counting information RCNT may be changed. As the refresh signal REF is enabled, the normal refresh operation NR may be performed again. After that, the above-described operations may be repeated.

According to FIG. 8C, the memory device may perform the weak refresh operation at least one time and the normal refresh operation at least one time in response to a predetermined refresh command, and a sequence in which the weak refresh operation and the normal refresh operation are performed may be changed. In FIG. 8C, the normal refresh operation may be performed after the weak refresh operation is performed, in the case where the refresh command REFC is applied for a third time, and the weak refresh operation may be performed after the normal refresh operation is performed, in the case where the refresh command REFC is applied for a fifth time.

Figure 8D:
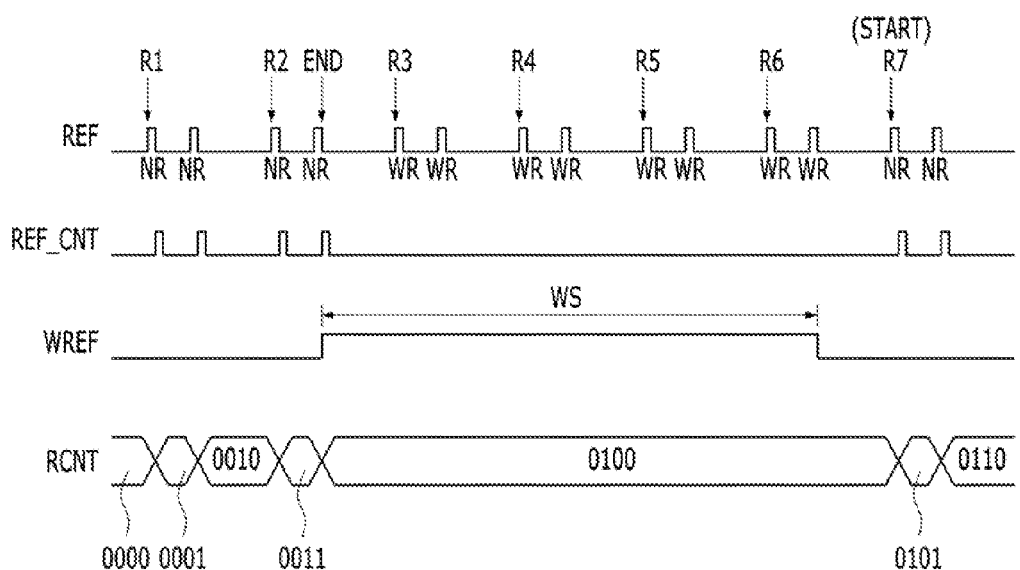

FIG. 8D is a diagram showing the case where the refresh signal REF is enabled two times when the refresh command REFC is applied and the weak refresh operation is performed when the refresh command REFC is enabled for a third R3), fourth (R4), fifth (R5) and for a sixth (R6) time. Herein, it is assumed that the weak refresh signal WREF is enabled when the refresh counting information RCNT is 0100 and is disabled when the refresh signal REF is enabled eight times after the weak refresh signal WREF is enabled.

Referring to FIG. 8D, in the case where the refresh counting information RCNT is 0000 to 0011 (i.e., 0000, 0001, 0010, and 0011) and 0101 or over 0101, because the weak refresh signal WREF is not enabled, the normal refresh operations NR may be performed when the refresh signal REF is enabled. When the refresh counting information RCNT becomes 0100, the weak refresh signal WREF is enabled. When the refresh signal REF is enabled in the state in which the weak refresh signal WREF is enabled, the weak refresh operation WR may be performed. After the weak refresh operation WR is performed successively eight times as the refresh signal REF is enabled eight times in the state in which the weak refresh signal WREF is enabled, the weak refresh signal WREF may be disabled. In the state in which the weak refresh signal WREF is enabled, since the refresh counting signal REF_CNT is not enabled, the value of the refresh counting information RCNT is not changed and is retained as 0100. If the refresh signal REF is enabled after the weak refresh signal WREF is disabled, the value of the refresh counting information RCNT may be changed. As the refresh signal REF is enabled, the normal refresh operation NR may be performed again.

For reference, according to FIG. 8D, the memory device may perform the weak refresh operation successively at least two times in response to at least two successive predetermined refresh commands.

For reference, the number of refreshes performed when a refresh command is applied one time, a time at which a weak refresh is performed, etc. may not be limited to the descriptions made above with reference to FIGS. 8A to 8D, and may be changed according to design.

The memory device of FIG. 5 may manage weak cells to operate normally, by performing a weak refresh using the weak addresses stored in the nonvolatile memory block 520, and may efficiently manage the weak cells through refresh operations of various combinations.

Figure 9:
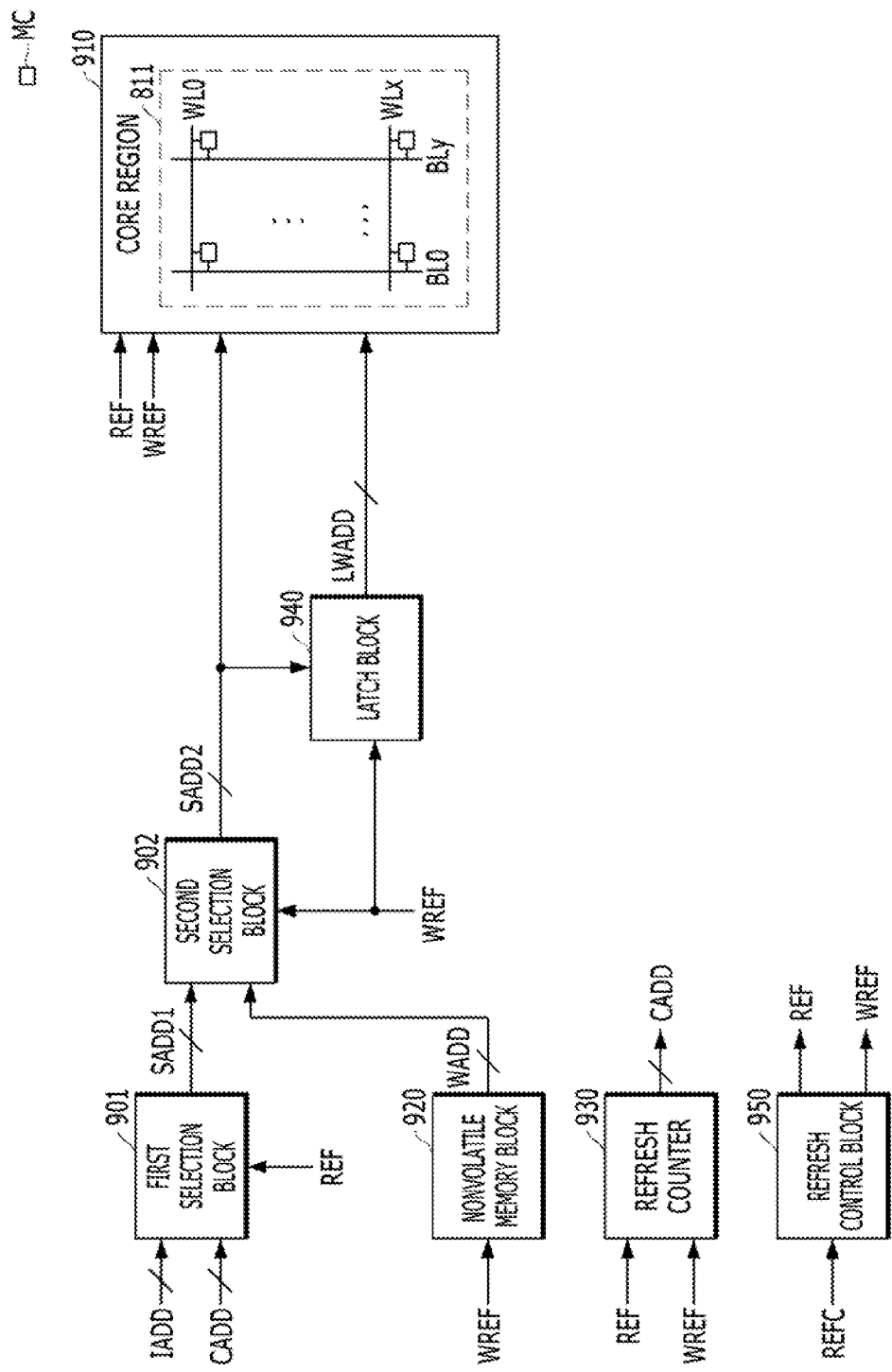
FIG. 9 is a configuration diagram illustrating an example of a memory device, according to an embodiment of the present invention.

FIG. 9 is a configuration diagram illustrating an example of a memory device, according to an embodiment of the present invention.

Referring to FIG. 9, a memory device may include a core region 910, a nonvolatile memory block 920, a refresh counter 930, a latch block 940, a refresh control block 950, a first selection block 901, and a second selection block 902.

The core region 910 may control a normal refresh operation to be performed for a word line corresponding to an address SADD2 outputted from the second selection block 902, in the case where a refresh signal REF is enabled in the state in which a weak refresh signal WREF is disabled. The core region 910 may control a weak refresh operation to be performed for a word line corresponding to an address LWADD outputted from the latch block 940, in the case where the refresh signal REF is enabled in the state in which the weak refresh signal WREF is enabled.

The first selection block 901 may output an address SADD1 by selecting a counting address CADD in a refresh operation, and output the address SADD1 by selecting an input address IADD in an operation other than the refresh operation. The first selection block 901 may output the address SADD1 by selecting the input address IADD in the case where the refresh signal REF is disabled, and output the address SADD1 by selecting the counting address CADD in the case where the refresh signal REF is enabled.

The second selection block 902 may output the address SADD2 by selecting the address SADD1 outputted from the first selection block 901, in the case where the weak refresh signal WREF is disabled, and output the address SADD2 by selecting an address WADD outputted from the nonvolatile memory block 920, in the case where the weak refresh signal WREF is enabled.

The nonvolatile memory block 920 may store one or more weak addresses. The nonvolatile memory block 920 may output, as the address WADD, one or more weak addresses programmed therein, in the weak refresh operation. The nonvolatile memory block 920 may output, as the address WADD, the stored weak addresses, when the weak refresh signal WREF is enabled. The address WADD outputted from the nonvolatile memory block 920 may be selected in and outputted from the second selection block 902, and be stored in the latch block 940.

The configuration and operation of the refresh counter 930 may be the same as the configuration and operation of the refresh counter 230 of FIG. 2.

The latch block 940 may latch the address SADD2 outputted from the second selection block 902 in the case where the weak refresh signal WREF is enabled, and output the latched address SADD2 as the address LWADD.

The refresh control block 950 may enable the refresh signal REF by a preset number of times equal to or more than one time when a refresh command REFC is applied, count the number of times by which the refresh signal REF is enabled, and enable the weak refresh signal WREF for a predetermined period when the refresh signal REF is enabled by a predetermined number of times. The refresh control block 950 may be configured in the same manner as the refresh control block 550 of FIG. 7.

Figure 10:
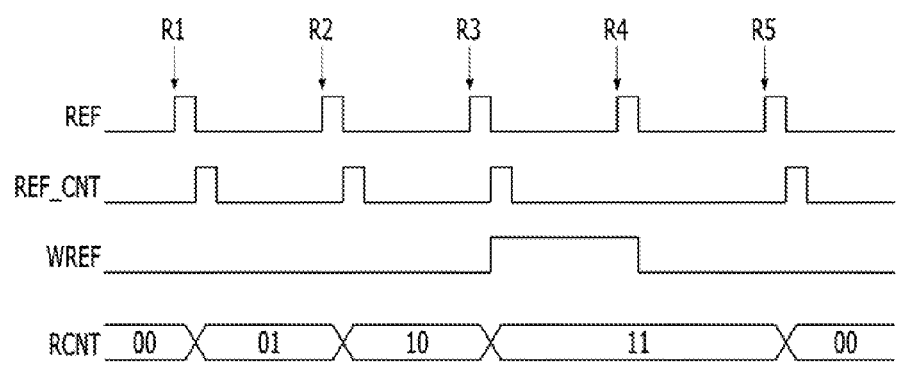
FIG. 10 is an example of a diagram to assist in the explanation of the operation of the refresh control block 950 shown in FIG. 9.

FIG. 10 is an example of a diagram to assist in the explanation of the operation of the refresh control block 950.

Referring to FIG. 10, it is assumed that a refresh counting information RCNT of 2 bits is generated and is repetitively counted as 00, 01, 10 and 11. Herein, the weak refresh signal WREF may be enabled when the refresh counting information RCNT becomes 11 and may be disabled when the refresh signal REF is enabled one time after the weak refresh signal WREF is enabled.

The refresh counting information RCNT may be enabled when a predetermined time passes after the refresh signal REF is applied first, second and third. The refresh counting information RCNT may be counted as 01 from 00, as 10 from 01 and as 11 from 10. If the refresh counting information RCNT becomes 11, the weak refresh signal WREF may be enabled. If the refresh command REFC is applied as R4 in the state in which the weak refresh signal WREF is enabled, the refresh signal REF is enabled and the refresh counting signal REF_CNT is not enabled. If the refresh signal REF is enabled in the state in which the weak refresh signal WREF is enabled, the weak refresh signal WREF is disabled.

If the refresh signal REF is enabled next, the refresh counting signal REF_CNT may be enabled, and the refresh counting information RCNT may be counted as 00. After that, the above-described operations may be repeated.

Figure 11:
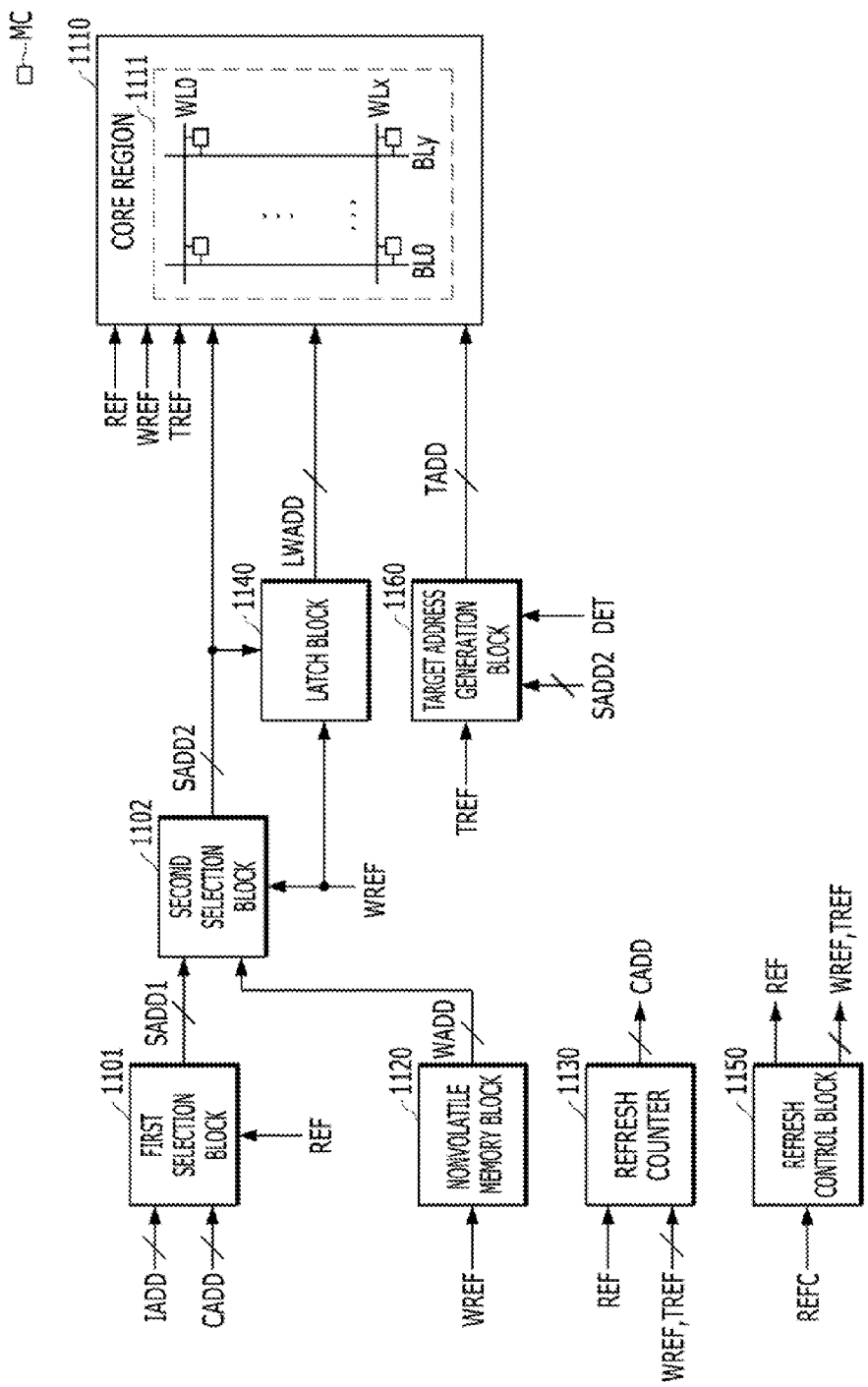
FIG. 11 is a configuration diagram illustrating an example of a memory device according to an embodiment of the present invention.

FIG. 11 is a configuration diagram illustrating an example of a memory device, according to an embodiment of the present invention.

Referring to FIG. 11, a memory device may include a core region 1110, a nonvolatile memory block 1120, a refresh counter 1130, a latch block 1140, a refresh control block 1150, a target address generation block 1160, a first selection block 1101, and a second selection block 1102.

The core region 1110 may control a normal refresh operation to be performed for a word line corresponding to an address SADD2 outputted from the second selection block 1102, in the case where a refresh signal REF is enabled in the state in which a weak refresh signal WREF and a target refresh signal TREF are disabled. The core region 1110 may control a weak refresh operation to be performed for a word line corresponding to an address LWADD outputted from the latch block 1140, in the case where the refresh signal REF is enabled in the state in which the weak refresh signal WREF is enabled and the target refresh signal TREF is disabled. The core region 1110 may control a target refresh operation to be performed for a word line corresponding to an address TADD outputted from the target address generation block 1160, in the case where the refresh signal REF is enabled in the state in which the weak refresh signal WREF is disabled and the target refresh signal TREF is enabled.

The configurations and operations of the first and second selection blocks 1101 and 1102 may be the same as the configurations and operations of the first and second selection blocks 901 and 902 of FIG. 9. The configuration and operation of the nonvolatile memory block 1120 may be the same as the configuration and operation of the nonvolatile memory block 920 of FIG. 9. The configuration and operation of the latch block 1140 may be the same as the configuration and operation of the latch block 940 of FIG. 9.

The refresh counter 1130 may perform counting each time the refresh signal REF is enabled, and generate a counting address CADD. For example, the refresh counter 1130 may increase the value of the counting address CADD by 1 each time the refresh signal REF is enabled. Increasing the value of the counting address CADD by 1 indicates that the counting address CADD is changed so that, if a K^th word line is selected this time, a (K+1)^th word line is selected next time. However, in the case where the weak refresh signal WREF or the target refresh signal TREF is enabled, the refresh counter 1130 does not perform counting even though the refresh signal REF is enabled, and causes the value of the counting address CADD to be retained, i.e. stay unchanged.

The refresh control block 1150 may enable the refresh signal REF by a preset number of times equal to or more than one time when a refresh command REFC is applied, count the number of times by which the refresh signal REF is enabled, enable the weak refresh signal WREF for a predetermined period when the refresh signal REF is enabled by a predetermined number of times, and enable the target refresh signal TREF for a predetermined period when the refresh signal REF is enabled by a predetermined number of times.

The target address generation block 1160 may store the address of a row hammer word line of which activation count is equal to or greater than a reference count or of which activation frequency is equal to or higher than a reference frequency, among a plurality of word lines WL0 to WLx, and generate the target address TADD by adding or subtracting a predetermined value to or from the stored address of the row hammer word line in the case where the target refresh signal TREF is enabled. For example, the target address TADD may be a value that is acquired by adding or subtracting 1 to or from the stored address. If a detection signal DET, which is enabled when an activation count is equal to or greater than the reference count or an activation frequency is equal to or higher than the reference frequency, is enabled, the target address generation block 1160 may store the output address SADD2 of the second selection block 1102.

Figure 12:
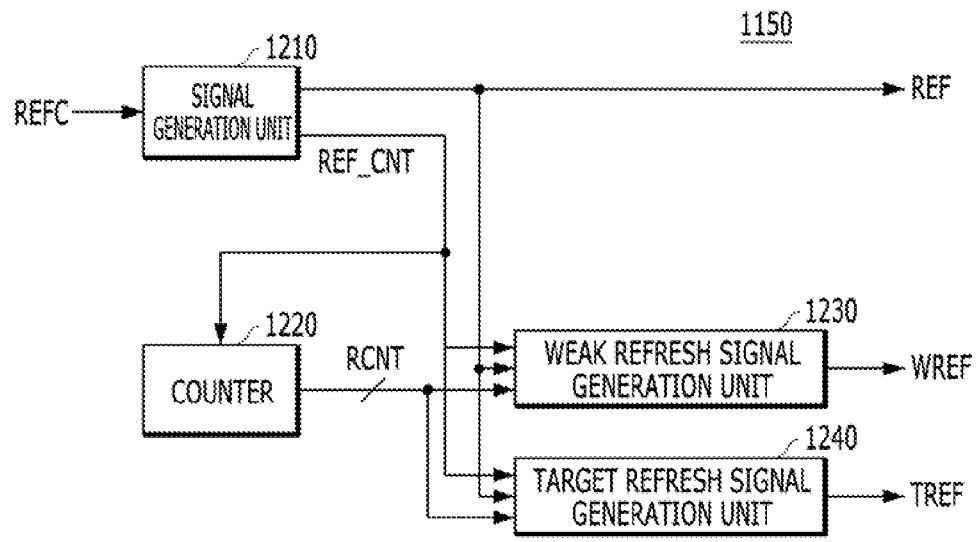
FIG. 12 is a configuration diagram illustrating an example of the refresh control block 1150 shown in FIG. 11.

FIG. 12 is a configuration diagram illustrating an example of the refresh control block 1150.

Referring to FIG. 12, the refresh control block 1150 may include a signal generation unit 1210, a counter 1220, a weak refresh signal generation unit 1230, and a target refresh signal generation unit 1240.

The configuration and operation of the signal generation unit 1210 may be the same as the configuration and operation of the signal generation unit 710 of FIG. 7. The configuration and operation of the counter 1220 may be the same as the configuration and operation of the counter 720 of FIG. 7. The configuration and operation of the weak refresh signal generation unit 1230 may be the same as the configuration and operation of the weak refresh signal generation unit 730 of FIG. 7.

The target refresh signal generation unit 1240 may enable the target refresh signal TREF in response to the refresh counting signal REF_CNT in the case where the value of a refresh counting information RCNT corresponds to a predetermined value, and disable the target refresh signal TREF when the refresh signal REF is enabled by a preselected number of times in the state in which the target refresh signal TREF is enabled.

Figure 13:
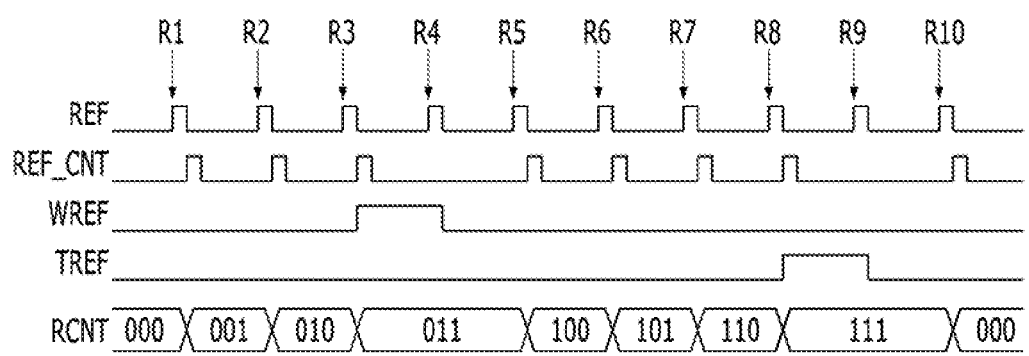
FIG. 13 an example of a diagram to assist in the explanation of the operation of the refresh control block 1150 shown in FIG. 11.

FIG. 13 is an example of a diagram to assist in the explanation of the operation of the refresh control block 1150.

Referring to FIG. 13, it is assumed that the refresh counting information RCNT of 3 bits is generated and is repetitively counted as 000, 001, 010, 011, 100, 101, 110 and 111, by the counter 1220. Herein, the weak refresh signal WREF may be enabled when the refresh counting information RCNT becomes 011 and may be disabled when the refresh signal REF is enabled one time after the weak refresh signal WREF is enabled. Moreover, the target refresh signal TREF may be enabled when the refresh counting information RCNT becomes 111 and be disabled when the refresh signal REF is enabled one time from the enabled state of the target refresh signal TREF.

The refresh counting signal REF_CNT may be enabled when a predetermined time passes after the refresh signal REF is enabled for a first, second and third time. The refresh counting information RCNT may be counted as 001 from 000, as 010 from 001 and as 011 from 010. When the refresh counting information RCNT becomes 011, the weak refresh signal WREF is enabled. When the refresh signal REF is enabled in the state in which the weak refresh signal WREF is enabled, the refresh counting signal REF_CNT is not enabled. When the refresh signal REF is enabled in the state in which the weak refresh signal WREF is enabled, the weak refresh signal WREF is disabled.

If the refresh signal REF is enabled next, the refresh counting signal REF_CNT may be enabled, and the refresh counting information RCNT may be counted as 100. Thereafter, the refresh counting information RCNT may be enabled when a predetermined time passes after the refresh signal REF is enabled sixth, seventh and eighth. The refresh counting information RCNT may be counted as 101 from 100, as 110 from 101 and as 111 from 110. If the refresh counting information RCNT becomes 111, the target refresh signal TREF may be enabled. If the refresh signal REF is enabled in the state in which the target refresh signal TREF is enabled, the refresh counting signal REF_CNT is not enabled. If the refresh signal REF is enabled in the state in which the target refresh signal TREF is enabled, the target refresh signal TREF is disabled.

If the refresh signal REF is enabled next, the refresh counting signal REF_CNT may be enabled, and the refresh counting information RCNT may be counted as 000. After that, the above-described operations may be repeated.

The memory devices of FIGS. 9 and 11 may manage weak cells to operate normally, by performing a weak refresh using the weak addresses stored in the nonvolatile memory blocks 920 and 1120, and may cause a weak refresh (or a weak refresh or a target refresh) to be performed according to a value acquired through counting the number of times by which the refresh signal REF is enabled, by the refresh control blocks 950 and 1150.

A weak address may be an address which corresponds to one or more weak memory cells or a weak word line. The weak memory cells may have data retention times that are less than a reference time and the weak word line may a word line which corresponds to one or more the weak cells.

In this technology, as a memory device performs various refresh operations, memory cells having a data retention time not exceeding a reference retention time may normally operate.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a plurality of memory cells;
   a nonvolatile memory block suitable for simultaneously sensing one or more programmed weak addresses, and sequentially transmitting the sensed weak addresses;
   a weak address control block suitable for latching the weak addresses transmitted from the nonvolatile memory block, and outputting sequentially the latched weak addresses in a weak refresh operation; and
   a refresh control block suitable for controlling the memory cells corresponding to the counting address to be refreshed, in a normal refresh operation, and controlling the memory cells corresponding to the weak address to be refreshed, in the weak refresh operation.

2. The memory device according to claim 1, wherein the nonvolatile memory block comprises:
   a cell array;
   a plurality of sensing units suitable for sensing the one or more weak addresses stored in the cell array; and
   a transmission unit suitable for sequentially transmitting weak addresses sensed by the plurality of sensing units, with a time interval.

3. The memory device according to claim 1,
   wherein the weak address control block enables an ask signal in the case of performing the weak refresh operation, and
   wherein the nonvolatile memory block transmits the weak addresses to the weak address control block in response to the ask signal.

4. The memory device according to claim 1, wherein the refresh control block controls the weak refresh operation to be performed, when a refresh command is applied a predetermined number of times.

5. The memory device according to claim 1, wherein the weak address control block outputs one weak address among the latched weak addresses, when the refresh command is applied by the predetermined number of times corresponding to at least one time, in the case where a plurality of refresh commands are applied successively.

6. A memory device comprising:
a plurality of memory cells;
a refresh counter suitable for generating a counting address;
a nonvolatile memory block suitable for storing one or more weak addresses and transmitting the stored weak addresses;
a latch circuit suitable for latching the weak addresses transmitted from the nonvolatile memory block; and
a refresh control block suitable for enabling a refresh signal at least one time in response to a refresh command, and enabling a weak refresh signal for a period that is determined by the number of times by which the refresh signal is enabled,
wherein the memory cells corresponding to the counting address are refreshed in the case where the refresh signal is enabled, and the memory cells corresponding to a weak address latched by the latch circuit are refreshed in the case where the refresh signal and the weak refresh signal are enabled.

7. The memory device according to claim 6, wherein the refresh control block enables the weak refresh signal for a period in which the refresh signal is enabled at least one time, in response to a predetermined refresh command.

8. The memory device according to claim 6, wherein the refresh control block enables the weak refresh signal for a partial period of a period in which the refresh signal is enabled at least two times, in response to a predetermined refresh command, in the case where the refresh signal is enabled at least two times in response to the refresh command.

9. The memory device according to claim 6, wherein the refresh control block enables the weak refresh signal for a period in which the refresh command is applied successively a predetermined number of times corresponding to at least two times.

10. The memory device according to claim 6,
wherein the nonvolatile memory block transmits the weak addresses in a boot-up operation, and
wherein the latch circuit latches the weak addresses transmitted from the nonvolatile memory block in the boot-up operation.

11. The memory device according to claim 6,
wherein the nonvolatile memory block transmits the weak addresses in response to the weak refresh signal, and
wherein the latch circuit latches the weak addresses transmitted from the nonvolatile memory block in response to the weak refresh signal, and outputs the latched weak addresses.

12. The memory device according to claim 11, further comprising:
a first selection block suitable for selecting and outputting the counting address in the case where the refresh signal is enabled, and selecting and outputting an input address in the case where the refresh signal is disabled; and
a second selection bock suitable for selecting and outputting an address outputted from the first selection block in the case where the weak refresh signal is disabled, and selecting and outputting an address outputted from the nonvolatile memory block in the case where the weak refresh signal is enabled.

13. The memory device according to claim 6, wherein the refresh control block comprises:
a signal generation unit suitable for generating the refresh signal and a refresh counting signal by delaying the refresh signal, when the refresh command is applied;
a counter suitable for performing counting in response to the refresh counting signal and generating a refresh counting information; and
a weak refresh signal generation unit suitable for enabling the weak refresh signal in response to the refresh counting signal in the case where the refresh counting information has a predetermined value, and disabling the weak refresh signal when the refresh signal is enabled a predetermined number of times in a state in which the weak refresh signal is enabled.

14. The memory device according to claim 6, wherein the refresh counter performs counting when the refresh signal is enabled, and does not perform counting when the refresh signal is enabled in a state in which the weak refresh signal is enabled.

15. The memory device according to claim 6, further comprising:
a plurality of word lines each corresponding to one or more memory cells among the plurality of memory cells; and
a target address generation block suitable for storing an address of a row hammer word line of which activation count is equal to or greater than a reference count or of which activation frequency is equal to or higher than a reference frequency, among the plurality of word lines, and generate a target address by adding or subtracting a predetermined value to or from the stored address of the row hammer word line in the case where a target refresh signal is enabled.

16. The memory device according to claim 15, wherein the refresh control block comprises:
a signal generation unit suitable for generating the refresh signal and a refresh counting signal by delaying the refresh signal, when the refresh command is applied;
a counter suitable for performing counting in response to the refresh counting signal and generating a refresh counting information;
a weak refresh signal generation unit suitable for enabling the weak refresh signal in response to the refresh counting signal in the case where the refresh counting information has a predetermined first value, and disabling the weak refresh signal when the refresh signal is enabled a predetermined first number of times in a state in which the weak refresh signal is enabled; and
a target refresh signal generation unit suitable for enabling the target refresh signal in response to the refresh counting signal in the case where the refresh counting information has a predetermined second value, and disabling the target refresh signal when the refresh signal is enabled a predetermined second number of times in a state in which the target refresh signal is enabled.

17. The memory device according to claim 15, wherein the refresh counter performs counting when the refresh signal is enabled, and does not perform counting when the refresh signal is enabled in a state in which the weak refresh signal or the target refresh signal is enabled.

18. A method of refreshing memory cells, comprising:
refreshing a plurality of first memory cells in a core region; and
refreshing a plurality of second memory cells in the core region more frequently than the first memory cells,
wherein the refreshing the plurality of second memory cells comprises:
storing a plurality of weak addresses in a nonvolatile memory block coupled to the core region;
simultaneously sensing the plurality of weak addresses; and
sequentially transmitting the plurality of weak addresses with a time interval to the core region,
wherein the nonvolatile memory block comprises:
a cell array storing the plurality of weak addresses;
a plurality of sensing units sensing the plurality of weak addresses stored in the cell array; and
a transmission unit sequentially transmitting the plurality of weak addresses sensed by the plurality of sensing units, with a time interval.

19. The method of claim 18, further comprising:
a weak address control block connected between the nonvolatile memory block and the core region,
wherein the weak address control block is configured to latch the weak addresses transmitted from the nonvolatile memory block, and output sequentially the latched weak addresses.

* * * * *